United States Patent [19]

Nakano et al.

[11] Patent Number: 5,218,335
[45] Date of Patent: Jun. 8, 1993

[54] ELECTRONIC CIRCUIT DEVICE HAVING THIN FILM RESISTOR AND METHOD FOR PRODUCING THE SAME

[75] Inventors: Asao Nakano, Kamakura; Kiyoshi Ogata, Yokohama; Makiko Kohno, Kawasaki; Yasunori Narizuka, Hiratsuka, all of Japan

[73] Assignee: Hitachi, Ltd., Tokyo, Japan

[21] Appl. No.: 690,350

[22] Filed: Apr. 24, 1991

[30] Foreign Application Priority Data

Apr. 24, 1990 [JP] Japan .................................. 2-107758

[51] Int. Cl.[5] ............................................ H01C 1/012
[52] U.S. Cl. ................................... 338/308; 338/225; 338/223; 204/192.21
[58] Field of Search ............... 338/238, 308, 225, 223; 29/25.42; 204/192.21; 357/51, 16, 23.7

[56] References Cited

U.S. PATENT DOCUMENTS

| | | | |
|---|---|---|---|
| 4,010,312 | 3/1977 | Pinch et al. ................. | 204/192.21 X |
| 4,343,986 | 8/1992 | Mitani et al. ......................... | 219/216 |
| 4,460,494 | 7/1984 | Abe et al. ............................. | 252/512 |
| 4,749,981 | 7/1988 | Yui et al. .............................. | 338/225 |
| 5,068,756 | 11/1991 | Morris et al. .......................... | 357/16 |

FOREIGN PATENT DOCUMENTS

| | | |
|---|---|---|
| 0007598 | 2/1980 | European Pat. Off. . |
| 1923827 | 9/1970 | Fed. Rep. of Germany . |
| 1957717 | 4/1973 | Fed. Rep. of Germany . |
| 3110580 | 5/1984 | Fed. Rep. of Germany . |
| 271044 | 8/1989 | Fed. Rep. of Germany ......................... 204/192.21 |
| 541898 | 1/1979 | Japan . |
| 58-84401 | 5/1983 | Japan . |
| 1514527 | 6/1978 | United Kingdom . |

OTHER PUBLICATIONS

S. M. Ojha, Thin Solid Films 57(1979) 363–366.
J. F. Henrickson, et al., Journal of Applied Physics, vol. 40, No. 13, Dec. 1969 pp. 5006–5014.
W. M. Paulson, et al., J. Vac. Sci. Technol., vol. 14, No. 1, Jan./Feb. 1977, pp. 210–218.
Phys. B11 (1975) pp. 2795–2811, Lee, et al. "Theory of the Extended X-ray Absorption Fine Structure".
Physical Society of Japan, vol. 34, No. 7, (1979), pp. 589–598.
DE–Z: "radiomentor" 11 (1968) S. 786 bis 789.
DE–Z: "industrie elektrik & elektronik" 16. Jahrgang (1971) No. 17 S. 435 bis 438.

Primary Examiner—Marvin M. Lateef
Attorney, Agent, or Firm—Antonelli, Terry, Stout & Kraus

[57] ABSTRACT

In an electronic circuit device, a thin film resistor is formed on a substrate and includes first regions including one kind of atom such as Cr and exhibiting an electric conductivity and a second region including a compound such as $SiO_2$ composed of two kinds of atoms and exhibiting an insulating property. In the thin film resistor, the first regions are scattered in the second region and have an average particle size of 2 nm to 20 nm.

31 Claims, 12 Drawing Sheets

ELECTRONIC CIRCUIT DEVICE HAVING THIN FILM RESISTOR AND METHOD FOR PRODUCING THE SAME

BACKGROUND OF THE INVENTION

1. Field of the Invention

The present invention relates to an electronic circuit device having a thin film resistor and a method for producing the same, and more particularly to an electronic circuit device for use in a multilayer wiring board, a heater element and the like and a method for producing the same.

2. Description of the Background Art

In a conventional electronic circuit device, a thin film resistor is formed on an insulating substrate made of a ceramic or the like or on an insulating film or the like laminated on the substrate by using a thin film technique such as sputtering or the like.

The thin film resistor of this kind, for example, is used for a resistor device in an electronic circuit, a resistor device in a thin film multilayer wiring board, or a heater device of a thermal print head in a printer or facsimile. In such a use, for example, a thin film multilayer wiring board, the following conditions are required, that is, a resistance can be determined to a predetermined value, a resistance value change with the passage of time is small, and a resistance value change with a temperature variation is small. Further, it is also desired that, even when a high temperature is repeatedly added to, its characteristics are not changed.

Conventionally, a thin film resistor is composed of a Cr-Si alloy, a Cr-SiO compound, a Cr-Si-SiO compound or the like, as disclosed in U.S. Pat. No. 4,343,986 and Japanese Patent Laid-Open Specifications Nos. 54-1898 and 58-84401.

However, when a conventional thin film resistor, for instance, is held in an atmosphere of a temperature of approximately 200° to 300° C. for a long time, the resistance value is changed as the time passes, and an operation of an electronic circuit becomes unstable, resulting in that the expected efficiency can not be maintained.

For example, in a thin film wiring board, an insulating layer of a resin material such as a polyimide or the like is interposed between conductive layers to laminate a plurality of wiring layers. In this process, in order to cure the polyimide, the board is heated to several hundreds °C. of temperature and the heating is held a certain time of period. Accordingly, when a thin film resistor is provided in any layer of the multilayer wiring board, the resistance value of the thin film resistor is irreversibly changed by the curing. Further, since the resistance value change is not regular, even when the resistance value of the thin film resistor is designed in consideration of the resistance value change at its film formation, the resistance value is often changed to a value outside of its desired value or range, and thus a yield and productivity of the thin film resistor is low.

When a thin film resistor is used for a heater device, by repeating a heat generation, its resistance value is largely changed, and the desired heat generating capacity is not obtained. In an extreme case, a wiring is cut down or the resistor is broken. In a thermosensible recording head, when such a reduction of the heat generation capacity is caused, a printing is not effected at a heater device present portion to bring about a blank portion.

SUMMARY OF THE INVENTION

Accordingly, it is a first object of the present invention to provide an electronic circuit device having a thin film resistor, free from the aforementioned defects and disadvantages of the prior art, which is capable of improving electric characteristics such as stability and resistance value change with reference to temperature changes, determining a specific resistance of the thin film resistor to a desired value without largely changing its temperature characteristics, and minimizing an electric resistance value change of the thin film resistor so as to maintain the expected characteristics for a long time.

It is a second object of the present invention to provide a method for producing an electronic circuit device having a thin film resistor, free from the aforementioned defects and disadvantages of the prior art, which is capable of improving electric characteristics such as stability and resistance value change with reference to temperature changes, determining a specific resistance of the thin film resistor to a desired value without largely changing its temperature characteristics, and minimizing an electric resistance value change of the thin film resistor so as to maintain the expected characteristics for a long time.

In order to achieve the first object, in accordance with one aspect of the present invention, there is provided an electronic circuit device, comprising a substrate, and at least one thin film resistor formed on the substrate, the thin film resistor includes first regions each including at least one kind of atom and having an electric conductivity, and a second region including at least one compound composed of at least two kinds of atoms and having an insulating property, the first region being scattered in the second region and having an average particle size of approximately 2 nm to 20 nm.

The first regions are preferably made of Cr. The compound composed of the two kinds of atoms and constituting the second region is preferably a compound of Si and oxygen, and more preferably $SiO_2$.

The first regions are formed of a Cr atom amorphous microcluster structure, and the second region is a $SiO_2$ amorphous structure.

The electronic circuit device of the present invention can be provided with an insulating film formed on the substrate to cover the same. The thin film resistor can be formed on the insulating film. A conductive film is further formed on the insulating film.

In the electronic circuit device of the present invention, an insulating film and at least one of a thin film resistor and a conductive film formed on the insulating film constitute a laminate unit, and a plurality of laminate units are laminated.

In the electronic circuit device of the present invention, a plurality of thin film resistors, each having a rectangular form, are arranged in parallel on the substrate, and each thin film resistor is provided with electrodes on its opposite ends to constitute a heater device.

In the thin film resistor of the present invention, a preferable thickness is at most 10 μm, but is not restricted to this value.

In order to accomplish the second object, in accordance with another aspect of the present, there is provided a method for producing an electronic circuit device, comprising the steps of forming a film on a substrate by sputtering a target including Cr and $SiO_2$, patterning the film to form a resistor film, and carrying out a heat treatment of the substrate having the resistor film thereon at a temperature of more than 350° C.

BRIEF DESCRIPTION OF THE DRAWINGS

These and other objects, features and advantages of the present invention will more fully appear from the following description of the preferred embodiments with reference to the accompanying drawings, in which.

DESCRIPTION OF THE PREFERRED EMBODIMENTS

The present invention will now be described in detail with reference to its preferred embodiments in connection with the accompanying drawings.

Figure 7:
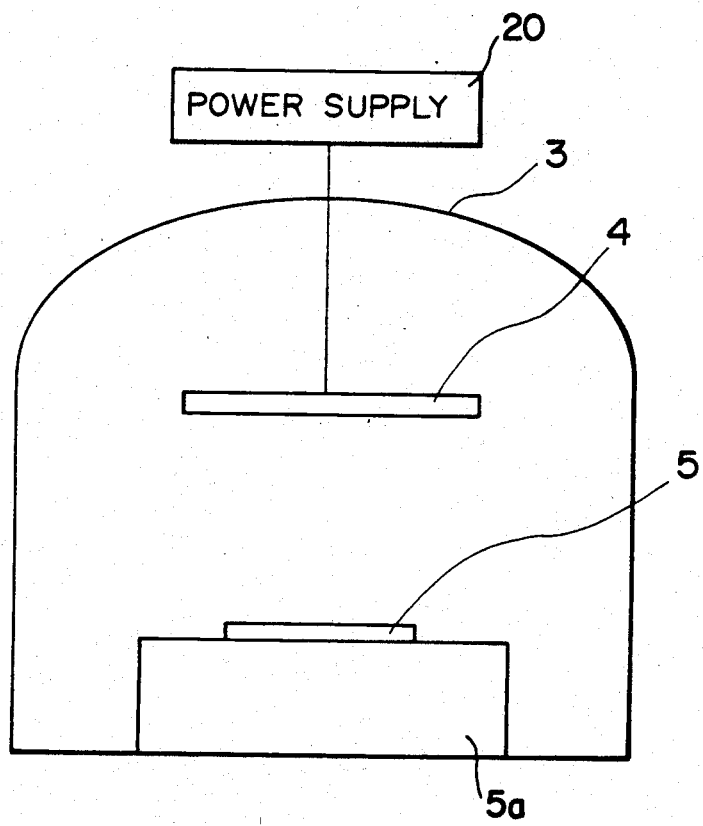
FIG. 7 is a schematic front view of a sputtering apparatus for use in preparing a thin film resistor of an electronic circuit device according to the present invention.

There is shown in FIG. 7 a sputtering apparatus for forming a film of a thin film resistor of an electronic circuit device according to the present invention. In a vacuum chamber (vessel) 3, a target 4 is horizontally arranged in its upper part, and a plate electrode 5a is located under the target 4 at a certain distance therebetween. A substrate 5 is mounted on the plate electrode 5a. A DC-AC power supply 20 for applying a voltage to the target 4 is connected to the target 4. The sputtering apparatus is also provided with a vacuum device (not shown) such as a vacuum pump for discharging a gas from the chamber 3 and a gas supply device (not shown) for introducing a gas into the chamber 3 which are connected to the chamber 3.

In the sputtering apparatus, the gas in the chamber 3 is discharged by the vacuum device and a gas such as argon Ar required for sputtering is introduced into the chamber from the gas supply device. A DC or AC power, particularly a high-frequency power is applied between the target 4 and the plate electrode 5a to carry out the sputtering. In the sputtering, a material or materials of the target 4 is decomposed to atomic level to emit the decomposed material toward the plate electrode 5a, and the decomposed material is deposited onto the substrate 5 mounted on the plate electrode 5a to form a thin film of the decomposed material on the surface of the substrate 5.

As examples of the target for forming a thin film resistor of an electronic circuit device, various materials can be given as follows.

Firstly, Cr metal and $SiO_2$ glass are used. In this instance, by varying Cr metal/$SiO_2$ glass exposure area ratio to the surface of the target 4, a composition to be deposited on the substrate 5 can be controlled. That is, by this method, a volume ratio between microcluster regions of Cr atom and $SiO_2$ is varied to change a resistance value of a deposited thin film. The control of the exposure area ratio, for example, can be performed by dividing the surface area of the target 4 at an area ratio according to a composition ratio between the Cr metal and the $SiO_2$ glass. More specifically, $SiO_2$ glass pieces having a slender rectangular form or a fan form are arranged on a Cr plate according to the composition ratio between these two members.

Secondly, Cr metal powder and $SiO_2$ powder are mixed at the desired composition ratio and the obtained mixture is sintered. The sintered member is used as the target 4. In this case, various sintered members having desired composition ratio between the two materials can be prepared in advance.

Thirdly, the target 4 is so formed from Cr metal and high purity Si by dividing its surface area at the desired exposure area ratio like the first method or preparing a sintered member of these two material mixed at the desired composition ratio like the second method that the Cr metal and the high purity Si may be the desired Cr/$SiO_2$ ratio. When a thin film is deposited by sputtering using this target 4, $O_2$ gas is mixed in the operation gas such as Ar and is reacted with to obtain a thin film resistor having an atomic level structure of the desired microcluster regions.

When the sputtering is carried out, the substrate 5 is preferably heated. This heating temperature can be low when a heat treatment of the substrate 5 is carried out after forming a thin film resistor. When no heat treatment is carried out, the heating temperature is preferably determined corresponding to a heat treatment temperature described hereinafter.

Figure 1:
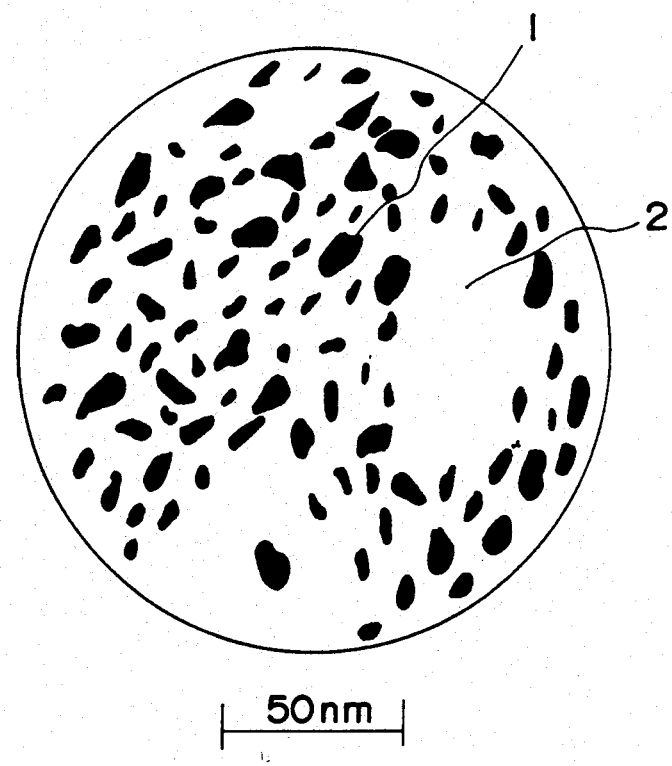
FIG. 1 is an enlarged schematic view showing a microcluster region structure of a metal, observed by using an electron microscope, in a specimen of a thin film resistor in an electronic circuit device according to the present invention.

Then, the first embodiment of an electronic circuit device having a thin film resistor according to the present invention will now be described in detail in connection with FIG. 1.

In the electronic circuit device, a thin film resistor for use in a resistor device in a multilayer wiring board or the like is formed on a substrate. The thin film resistor including three essential components Cr, Si and O is prepared by using the sputtering method. The film formation conditions are as follows.

Target: Cr/$SiO_2$ sintered body (Cr/$SiO_2$ ratio=2/1)

Substrate: aluminum plate having a dimension of 250 mm×200 mm having a polyimide film formed thereon Applied power: 1.5 kw Substrate temperature: room temperature to 100° C.

Under this condition, two specimens of substrates 5 are mounted on the plate electrode 5a in the vacuum vessel 3, and after discharging the gas within the vacuum vessel 3 to a pressure of approximately $2\times10^{-7}$ Torr by using the vacuum device, argon Ar gas is introduced into the vacuum vessel 3 to a pressure of approximately $2\times10^{-3}$ Torr by using the gas supply device. By applying a voltage from the power supply 20 to the target 4, the sputtering is carried out for 20 minutes to form a thin film resistor on each substrate 5. One of the two specimens will be used for a comparative example. Another specimen as a present specimen is heat-treated at a temperature of 350° C. for 4 hours, and then its specific resistance is measured to obtain 6 m$\Omega$.cm as an exemplary value of a film thickness of 200 nm. In this case, the heat treatment is carried out in the argon gas. Another inert gas such as nitrogen or the like can be used in place of the argon gas.

In a Cr-Si-O three component system, it is important that Cr atoms gather by themselves to form Cr metal microclusters and Si and O atoms are coupled with each other to form $SiO_2$. When the specimen of this embodiment is observed by using an electron microscope, its microcluster structure is observed, as shown in FIG. 1. In FIG. 1, black portions exhibit microcluster regions 1 composed of Cr atoms only, and the other white area is $SiO_2$ region 2. An average particle size of the microcluster regions 1 of the obtained specimen is 2 to 20 nm. In the portion shown in FIG. 1, the microcluster regions having a size of 2 to 17 nm appear.

An electric conduction is effected by only the Cr microcluster regions 1, and the $SiO_2$ region 2 exhibits insulating property. Hence, by varying the Cr/$SiO_2$ ratio, any desired values can be obtained.

Such an atomic level structure can be confirmed by the following methods.

By a measurement using X-ray or electron beam diffractions, the average size and crystallized conditions of the cluster regions 1 can be roughly assumed. Since the X-ray or electron beam diffractions occur according to Bragg's formula (I), wherein $\theta$ is a diffraction angle and $\lambda$ is a wave length of X-ray or electron beam, when phases of scattering by atoms meet, sharp peak diffraction strengths are observed at a spacing d between particular atomic planes.

$$2d\cdot\sin\theta=\lambda \tag{I}$$

A relation between a peak width of X-ray diffraction and an average particle size $\eta$ of crystal particles occurring diffraction is represented by formula (II).

$$\eta = \frac{\lambda\cdot\tan\theta}{0.9\cdot\Delta\theta} \tag{II}$$

When the crystallization degree is lowered, the average particle size of the crystal particles becomes small, and the peak width of the diffraction strengths becomes wide.

Figure 2:
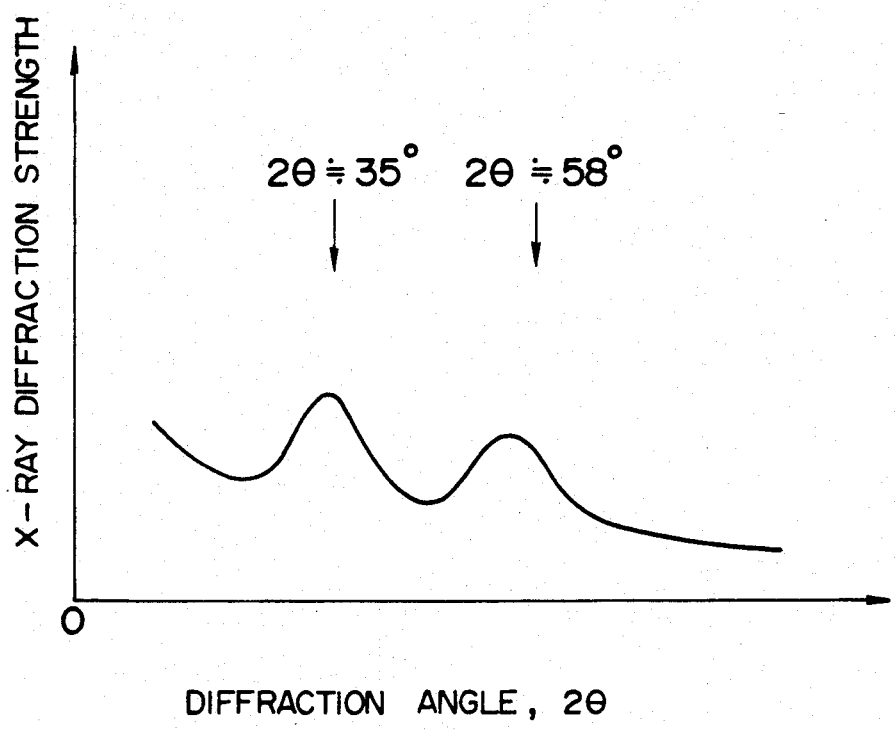
FIG. 2 is a graphical representation showing an X-ray diffraction pattern of a thin film resistor in an electronic circuit device according to the present invention.

As shown in FIG. 2, in a thin film resistor of the present embodiment, two peaks having a wide width are observed at positions near d=0.26 nm and d=0.16 nm. Crystal particles possess an average particle size of approximately several nm to 20 nm, and diffraction by the crystals can be hardly observed. It can be understood from the former and latter peaks that there exist a Cr-Cr coupling and a Si-O coupling, respectively.

Then, by extended X-ray absorption fine structure (EXAFS) analysis, an atomic level structure around an attentive atom can be obtained. Relating to the EXAFS, the detail is disclosed, for example, in "Bulletin of the Physical Society of Japan", Vol. 34, No. 7(1979), pp. 589-598, and "Physical Review B", Vol. 11, No. 8(1975), pp. 2795-2811.

Figure 3:
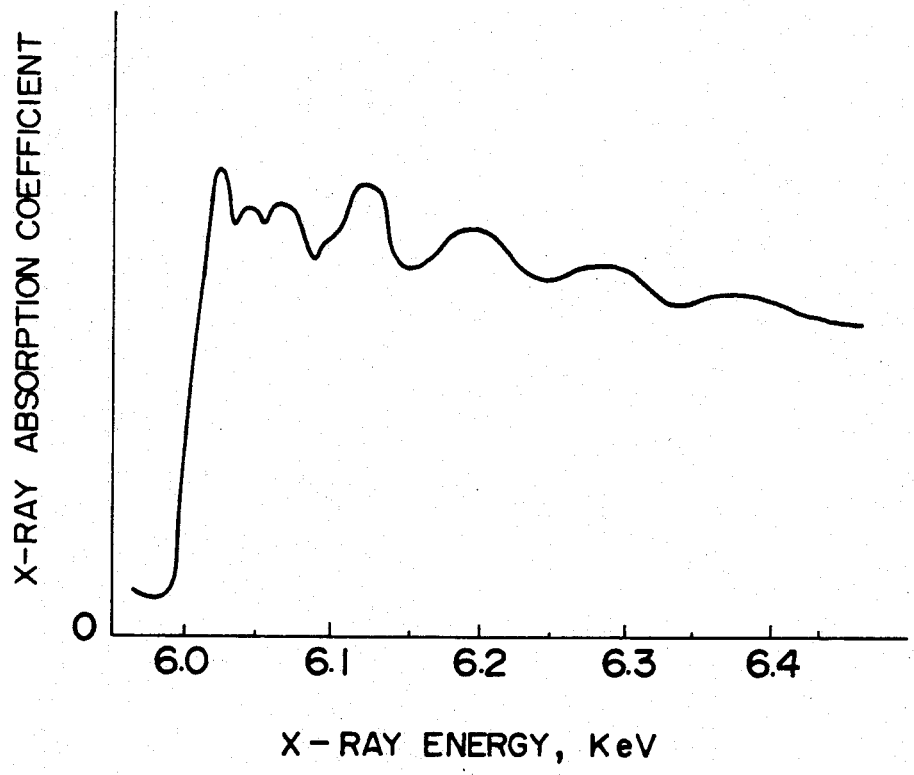
FIGS. 3 and 4 are graphical views showing EXAFS (extended X-ray absorption fine structure) measurement results of a thin film resistor in an electronic circuit device according to the present invention.
Figure 4:
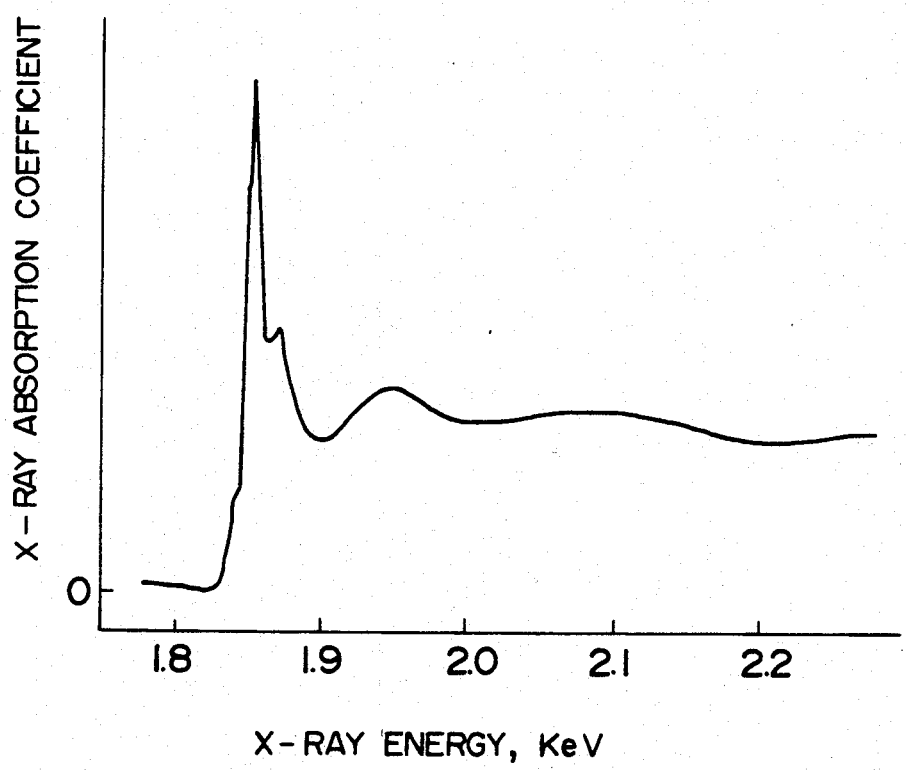

In FIGS. 3 and 4, there are shown EXAFS measurement results of a thin film resistor of the present embodiment. FIG. 3 shows an EXAFS measured at a K-X-ray absorption end of Si in order to analyze a surrounding structure of the Cr atom. FIG. 4 shows an EXAFS measured at a K-X-ray absorption end of Cr in order to analyze a surrounding structure of the Cr atom.

An atomic level structure analysis of a thin film resistor of the present embodiment, carried out on the basis of the above-described EXAFSs will be described in connection with FIGS. 5 and 6.

Figure 5:
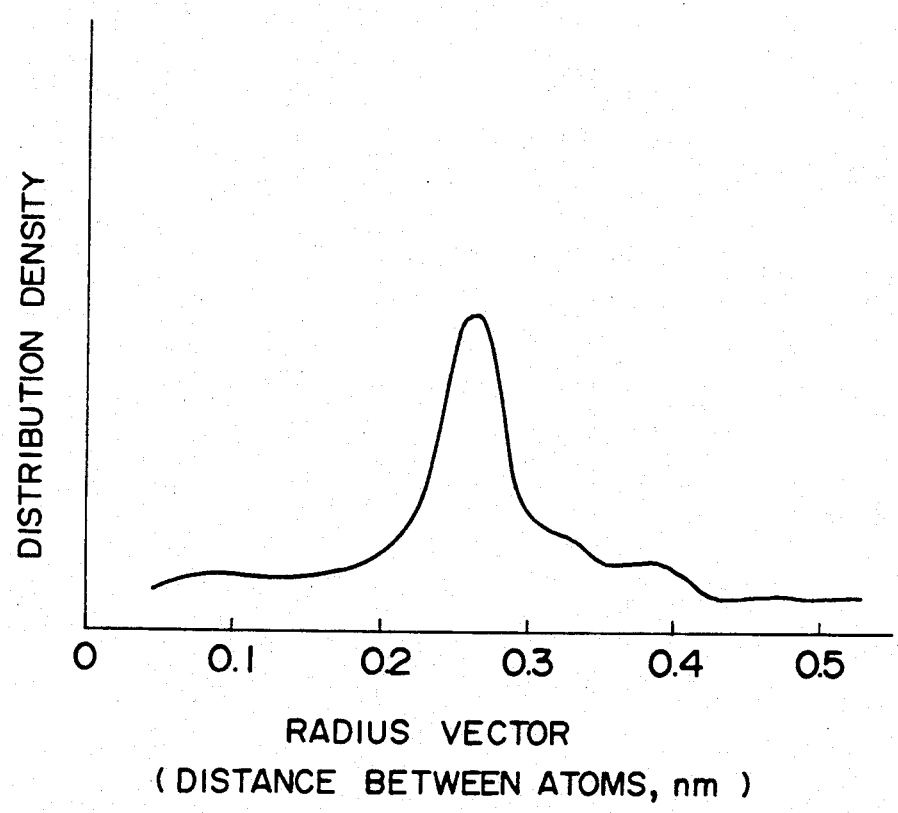
FIGS. 5 and 6 are graphical views showing radius vector distributions obtained from EXAFS the measurements shown in FIGS. 3 and 4.

FIG. 5 shows a radius vector distribution around a Cr atom, obtained from a CrK-EXAFS. It can be understood from this radius vector distribution that almost only Cr atoms exist around the Cr atom from its radius vector distance and a distance between the atoms. More specifically, by comparing this radius vector distribution with a radius vector distribution previously obtained from the CrK-EXAFS relating to the bulk of a Cr standard specimen, the analysis can be conducted. When a comparison of the radius vector distribution of the specimen of the above described example with that of the standard specimen is carried out, the result is very much identified.

Figure 6:
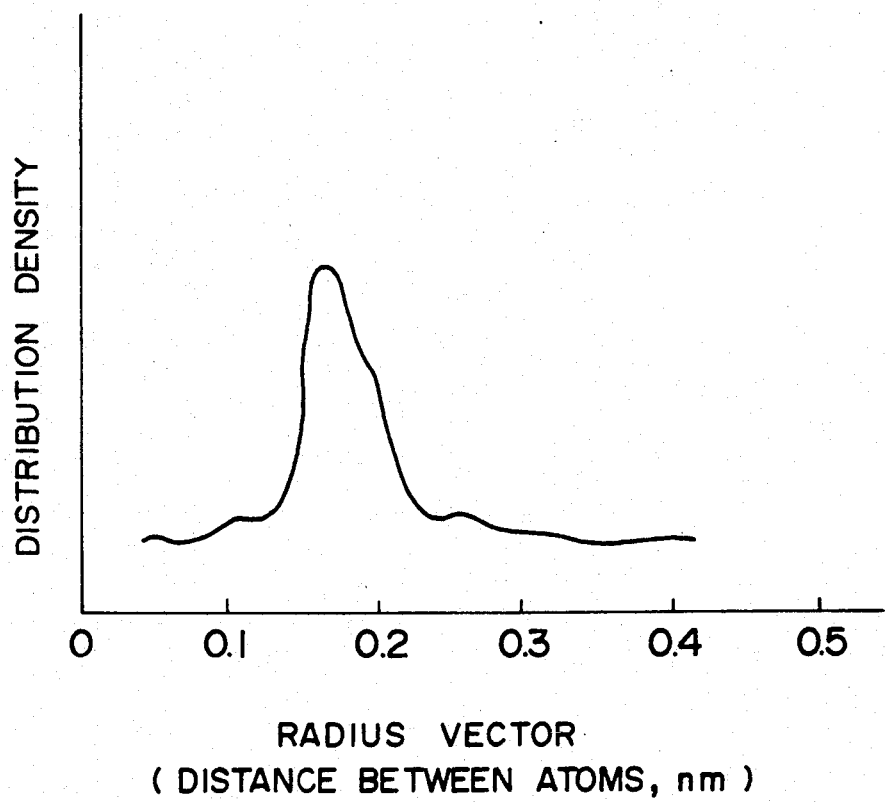

FIG. 6 shows a radius vector distribution around a Si atom, obtained from a SiK-EXAFS. It can be understood from this radius vector distribution that almost only oxygen atoms exist around the Si atom from its radius vector distance and a distance between the atoms. When a comparison of the radius vector distribution of the specimen of the above described example with that of a standard specimen is carried out in the same manner as the above described Cr case, the result is very much identified as well.

The structure of the thin film resistor of the present embodiment is obtained on the basis of these analysis results, and it is found that the Cr atoms hardly connect with the oxygen atom and the Cr atoms constitute the microcluster regions having an average particle size of 2 to 20 nm. Meanwhile, it is found that the Si atoms partially connect with the Cr atom, but almost all of the Si atoms connect with the oxygen atoms to constitute amorphous $SiO_2$. A relative frequency distribution of average particle sizes of the microcluster regions measured of the obtained specimen is shown by a curve B in FIG. 10.

On the other hand, with respect to the comparative specimen which is not heat-treated, the analysis is carried out in the same manner as described above, and it is found that Cr atom microcluster regions and amorphous $SiO_2$ regions exist in a mixed form in the obtained thin film. However, in the comparative specimen, an average particle size of the Cr atom microcluster regions is 0.5 to 8 nm. A relative frequency distribution of average particle sizes of the microcluster regions measured of the comparative specimen is shown by a curve A in FIG. 10.

Figure 10:
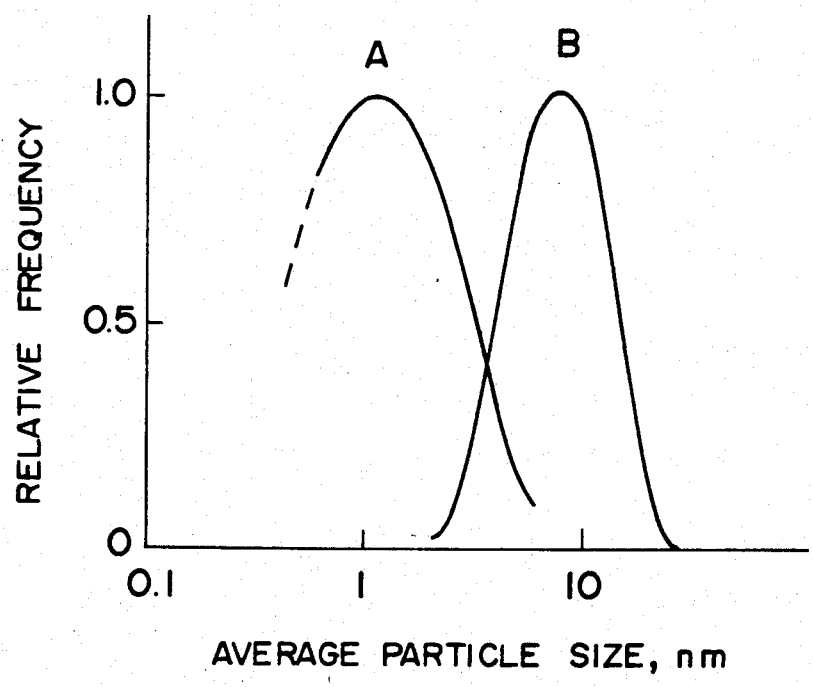
FIG. 10 is a graphical representation showing a relative frequency distribution of an average particle size of micro-cluster regions appearing in a specimen of a present example of a thin film resistor in an electronic circuit device according to the present invention in comparison with that of a comparative example of the same.

As apparent from a comparison between the curves A and B in FIG. 10, the average particle size of the Cr atom microcluster regions in the heat-treated specimen is larger that of the specimen which is not heat-treated. When a heat treatment is carried out at a temperature lower than 350° C., an intermediate distribution between the curves A and B is obtained.

Figure 11:
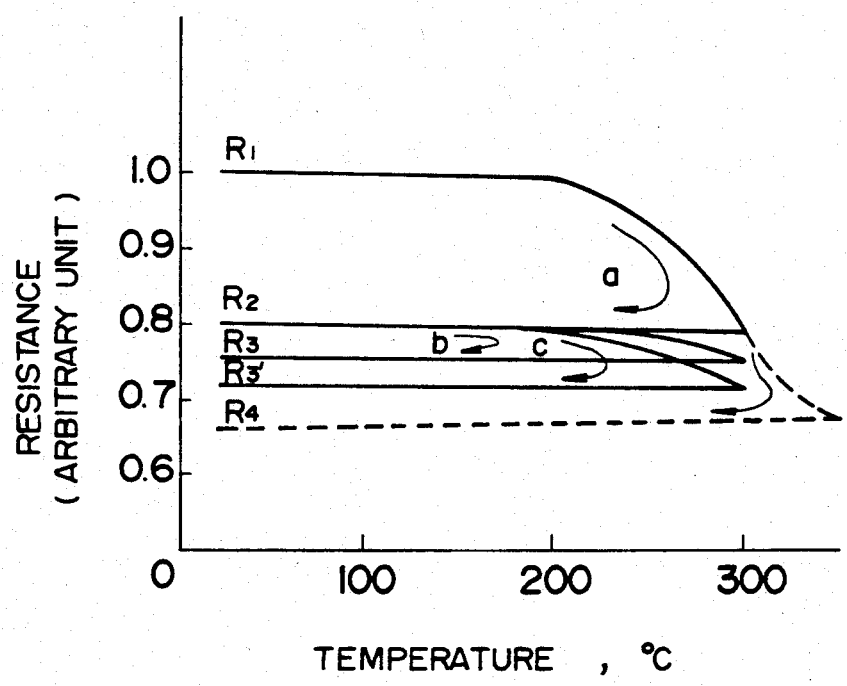
FIG. 11 is a graphical representation showing resistance value changes with reference to temperatures when a heat cycle is given to specimens of present and comparative examples.

The influence of this average particle size difference appears, as shown in FIG. 11, as to whether the resistance value change is present or absent when a heat cycle is given to the specimen. In FIG. 11, in order to make the comparison easy, the resistance values are normalized to an arbitrary unit.

That is, in FIG. 11, relating to the comparison specimen which is not heat-treated at a temperature of more than 350° C., assuming that an initial resistance value is R1 by an arbitrary unit, when the heat of a temperature of 300° C. is added, the resistance value is largely decreased to R2 as the temperature is increased, as indicated by an arrow a, and then by heating again at a temperature of 300° C., the resistance value is further changed to R3 or R3', as indicated by an arrow b or c. Furthermore, the resistance value change is not stable, and it is not possible to forecast whether the resistance value is changed to R3 or R3', to disperse the resistance value. Further, this is not limited to the heating and it is confirmed that this is also caused with age.

In respect of the present specimen heat-treated at a temperature of more than 350° C., as indicated by an broken line, even when the heating is repeated, the resistance value is changed to an almost fixed value R4 to be obtained after the heat treatment, and furthermore regarding the temperature characteristics of the resistance value, the resistance value becomes large as the temperature increases to exhibit a metallic property. Hence, a thin film circuit device having stable characteristics can be realized.

Concerning the specimen heat-treated at a temperature of less than 350° C., although the resistance value change is smaller as compared with the specimen heat-treated at a temperature of more than 350° C., by heating the specimen, as indicated by the arrows b and c, it is confirmed that the resistance value is irreversibly changed.

Next, in order to confirm the effects of the present embodiment, another comparative specimen is obtained by using the above-described sputtering apparatus in the same manner as described above except that the target is prepared by using $CrSi_2$ sintered member and $SiO_2$.

Relating to this comparative specimen, the structure is examined in the same manner as described above, and it is found that there exist Cr, $CrSi_2$ and CrSi mixed in $SiO_2$.

Figure 12:
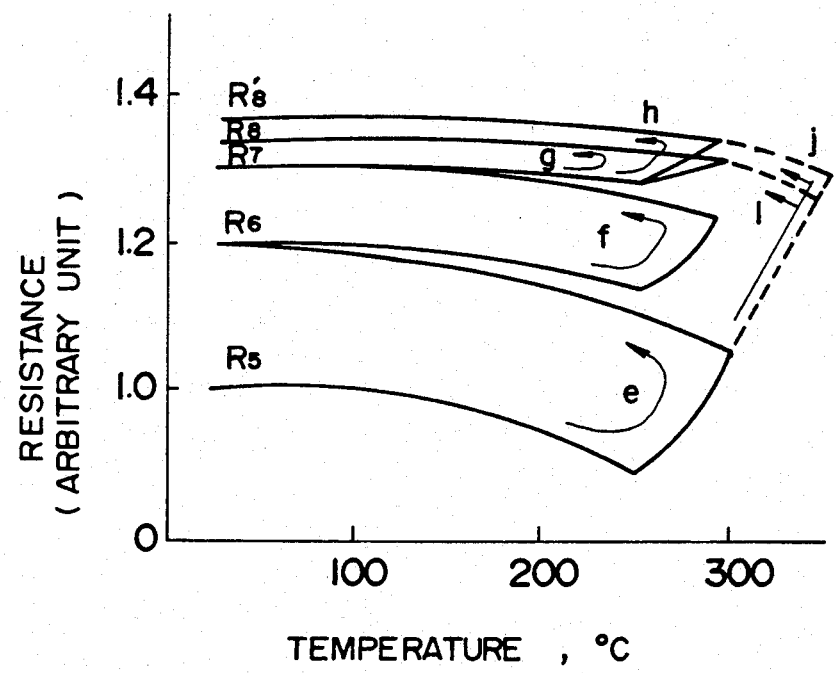
FIG. 12 is a graphical representation showing resistance value changes with reference to temperatures when a heat cycle is given to a specimen of a comparative example and a sputtering is carried out by using sintered $CrSi_2$ and $SiO_2$ as a target.

When this comparative specimen is heat-treated at a temperature of 300° C., the resistance value is changed to increase from its initial resistance value R5 to R6, as indicated by an arrow e in FIG. 12, which is different from the present embodiment described above. Further, when the heating is repeated, the resistance value is increased to R7, R8 or R8', as indicated by an arrow f, g or h in FIG. 12. Even when the comparative specimen is heat-treated at a temperature of more than 350° C., the resistance value is unstably increased, as indicated by an arrow i or j to disperse the resistance value.

It can be considered that this phenomenon is caused by breaking a coupling of Cr-Si by means of a heat treatment. Accordingly, it can be also considered that even when an average particle size distribution of the comparative specimen is shown by the curve B in FIG. 10, as far as the Cr-Si couplings exist, the couplings can be continuously broken by the heat to bring about the resistance value change and the unstable resistance value.

Further, a further comparative specimen prepared in the same manner as the above-described comparative specimen using the $CrSi_2$ sintered member and $SiO_2$ except a target formed from a $CrSi_2$ sintered member is examined to find that the resistance is unstable.

These structural changes of the comparative specimens can be analyzed by the above-described EXAFS measurement. Also, when the thin film resistor of the present embodiment is heat-treated at a temperature of 500° C. for 5 hours and is then analyzed by the EXAFS method as described above, the structure is almost the same as before the heat treatment, and the resistance value is almost the same as before the heat treatment. This teaches that the thin film resistor having a structure where the microcluster regions of the first component atom Cr are surrounded by the oxide, i.e., $SiO_2$ of the second component atom Si, is not changed by the heating of approximately 500° C.

Therefore, according to the present embodiment, even when an electronic circuit device is placed in a situation where a thin film resistor can be heated, no resistance value change is caused to maintain the expected capability. Hence, as described later, the electronic circuit device having the thin film resistor can be properly used for a thin film multilayer wiring board to be heated for annealing or the like after the thin film formation, a heater device or a heat generating device of a thermal print head to be repeatedly heated, and so forth.

Next, one embodiment of a high density multilayer wiring board utilizing the above-described thin film resistor of the present invention will now be described in detail with reference to FIG. 8.

Figure 8:
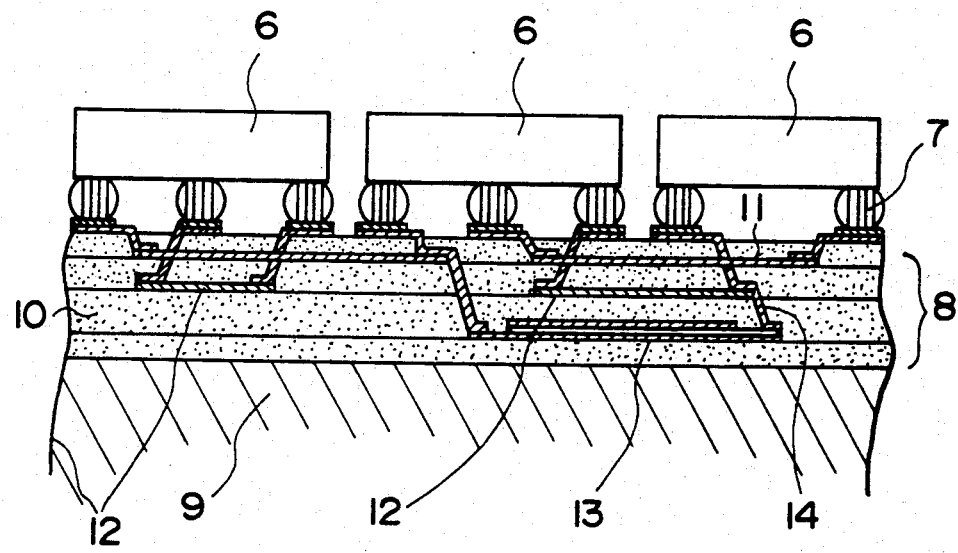
FIG. 8 is a cross sectional view of a multilayer wiring board including thin film resistors of an electronic circuit device according to the present invention.

In FIG. 8, semiconductor chips 6 are coupled on a thin film multilayer board 8 by means of solder 7. The thin film multilayer board 8 comprises a ceramic substrate 9, a plurality of insulating films 10 composed of a polyimide or the like having a thickness of 10–100 μm, conductor thin films 11, thin film resistors 12 having a thickness of 10 nm to 10 μm, and a capacitive thin film 13 for constituting a capacitor, in which the latter four members are laminated in a multilayer form. The laminated layers can be made to have their necessary contacts with one another by through-holes 14 to form a three-dimensional wiring to obtain a high density multilayer wiring board.

The insulating films 10 are formed, for example, by applying a polyimide precursor such as a polyamide acid or the like by using a spinner and heating the precursor for curing to form the polyimide films.

The polyimide films are formed with through-holes by means of photo-etching, ion-milling or the like. When a photosensitive polyimide film is used, an insulating film 10 can be formed by a photolithography technique while the through-hole can be opened in the same time.

The conductive thin films 11 are formed, for instance, by forming a base conductive film having a predetermined pattern by using the sputtering technique, the photolithography technique or the like, and by plating copper metal or the like on the base conductive film.

The thin film resistors 12 are formed on the insulating film 10 by using the sputtering technique as described above. In this embodiment, the thin film resistors 12 include the three essential components Cr, Si and oxygen. The thin film resistors 12 are heat-treated, for example, at a temperature of 350° C. for 4 hours after the thin film resistor formation, as described above. Then, the thin film resistors 12 are patterned to the desired shape by using a photoresist. Further, electrodes to be connected to the through-holes are attached to the thin film resistors 12, as required, in the same manner as the conductive thin films 11.

As described above, the thin film multilayer board 8 of the present embodiment is prepared by successively laminating the insulating films 10 to form a multilayer structure while the conductive thin films 11, the thin film resistors 12 and the through-holes 14 are formed in the same time. In this instance, a combination of the insulating film 10, the conductive thin film 11 and the thin film resistor, the latter two members being formed on the former, may be laminated as one laminate unit to form the multilayer structure while the necessary through-holes 14 are simultaneously formed for each laminate unit.

Then, bumps of the solder 7 are formed on the top of the thin film multilayer board 8, and the semiconductor chips 6 such as LSIs (large scale integration) are placed on the bumps. Then, the semiconductor chips 6 are soldered on the top of the thin film multilayer board 8 through the solder bumps 7 placed therebetween to obtain an electronic circuit device having a thin film resistor according to the present invention. The electronic circuit device of this kind can be used for a variety of electronic devices such as a processor of a computer.

When the polyimide is used as the insulating film, in order to reveal the properties of the polyimide, a so-called annealing or curing process, i.e., a heating process at a temperature of approximately 200° to 400° C. is required. When the thin film resistors 12 are caused with an atomic level change such as a phase transition or rearrangement or the like in such a heating temperature, the electric characteristics such as specific resistance and the like are also changed to bring about a dissatisfaction of the designed permissible values, thereby causing serious problems in stability of the circuits, a fabrication yield and so forth. According to the present embodiment, in a region structure type thin film resistor including metal atoms as an electric conductor gathering by themselves to form microcluster regions, Cr atom microcluster regions are each surrounded by $SiO_2$ having a heat-stable property. Hence, the structure of the thin film resistor can not be changed by heating at a temperature of approximately 400° to 500° C., and its electric characteristics are also stable.

In the thin film multilayer board of the present invention, since resistors and capacitors can be mounted within the multilayer wiring, the chip mounting surface of the board can be effectively used. Even when a capacitor is externally mounted on the surface of the board, by internally mounting a large number of resistors used within the board, it is possible to make a semiconductor chip occupying rate in a circuit board more than 50%. In the thin film multilayer board of the present invention, not only the resistors and capacitors can be mounted within the board, but also the height of the semiconductor chip surfaces can be aligned so as to make a mounting of a radiator for the semiconductor chips very easy.

Next, a high density heat generating circuit board having a minute heater device composed of the above-described thin film resistor as the second embodiment of the present invention according to the present invention will now be described in detail in connection with FIG. 9.

Figure 9:
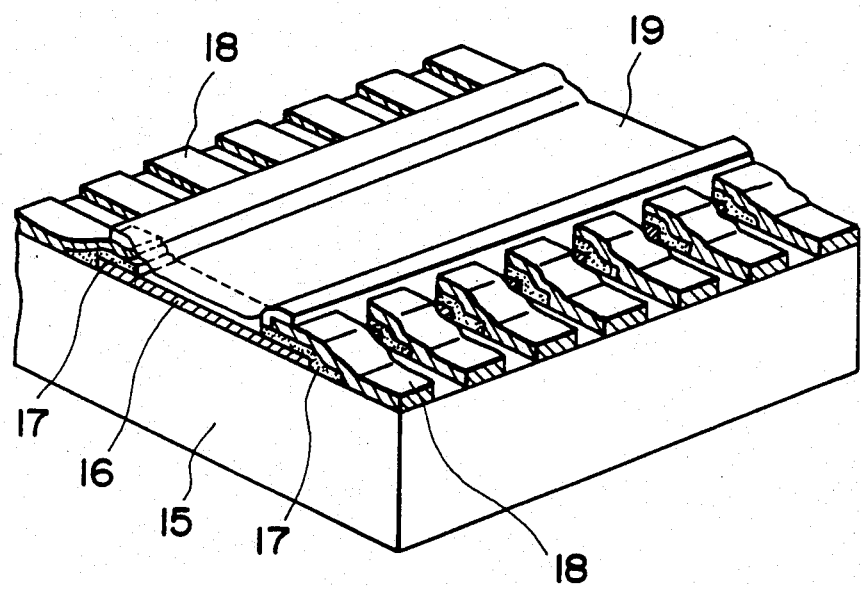
FIG. 9 is a fragmentary perspective view of a heater device circuit plate including heater resistors according to the present invention.

As shown in FIG. 9, in the high density heat generating or heater circuit plates, on a substrate 15 heat generating or heater resistors 16, barrier films 17, electric conductive films 18 and a protecting film 19 for the heater resistors 16 are formed.

A plurality of heater resistors 16 having a rectangular form are arranged in parallel on the substrate 15. The heater resistors 16 are formed, for example, by the sputtering in the same manner as the above-described thin film resistor. In this embodiment, the heater resistors 16 include three essential components Cr, Si and oxygen. The heater resistors 16 are patterned to the desired forms by using a photoresist after the formation of the thin film. The barrier films 17 and the conductive films 18 are successively formed on both ends of the heater resistors 16 arranged in parallel. The barrier films 17, for example, are composed of Cr for preventing the constituent atoms of the conductive films 18 from diffusing into the heater resistors 16. The conductive films 18, for example, are composed of Al.

On the obtained heater resistors 16 a heater resistor protecting film 19 is formed. This protecting film 19 is, for example, composed of $SiO_2$ for protecting the heater resistors 16 from their wearing away.

In this embodiment, relating to formation of the thin film for the heater resistors 16, in order to improve the heat generating efficiency of the heater resistor 16, a $Cr/SiO_2$ ratio of the target is reduced as compared with that for forming the above-described thin film resistor.

The thin film formation is carried out by the sputtering under the following conditions.

Target: $Cr/SiO_2$ sintered body ($Cr/SiO_2$ ratio=$\frac{1}{3}$)
Substrate: alumina plate having a dimension of 250 mm×200 mm having graze glass formed thereon
Applied power: 1.0 kw Substrate temperature: 100° C.

Under this condition, two specimens of substrates 5 are mounted on the plate electrode 5a in the vacuum vessel 3, and after discharging the gas within the vacuum vessel 3 to a pressure of approximately $1 \times 10^{-7}$ Torr by using the vacuum device, argon Ar gas is introduced into the vacuum vessel 3 to a pressure of approximately $3 \times 10^{-2}$ Torr by using the gas supply device. By applying a voltage from the power supply 20 to the target 4, the sputtering is carried out for 30 minutes to form a thin film resistor on each substrate 5. One of the two specimens will be used for a comparative example. Another specimen as a present specimen is heat-treated at a temperature of 350° C. for 4 hours, and then its specific resistance is measured to obtain 30 mΩ.cm as an exemplary value of a film thickness of 100 nm.

Then, another comparative specimen is obtained by using the sputtering apparatus in the same manner as the second embodiment described above except that the target is prepared by using $CrSi_2$ sintered member and $SiO_2$.

With respect to the obtained specimens, the structure analysis and the temperature characteristics measurements are carried out in the same manner as the first embodiment to obtain the same results as those obtained in the first embodiment except the difference of the resistance values.

In the heat generating circuit plate, a pulse of power is applied to each heater resistor 16 via the respective conductive film 18 to control the temperature of each heater resistor independently.

Then, a voltage is applied to the heater resistors in the same manner as a recording state, and the structure analysis of the heater resistors is carried out by the EXAFS to find that the structure is almost the same as before the heating, and the resistance values are almost the same as before the heating.

According to the present invention, a thermal print head can be produced by using the high density heat generating circuit board including a heater resistor having a width of less than 100 µm. By using this thermal print head, characters and figures can be printed on a monochrome or multicolor thermosensible paper. In this case, different from a conventional recording head, since this thermosensible recording head has an excellent thermal stability, even when the heat generation is repeated, variation of its characteristics is small, and it is not liable to break the wire due to segregation of the content without causing a blank printing to carry out a recording having an excellent quality.

A thermal print head having heater resistors of the present embodiment can be applied to a recording part of a facsimile, a printing apparatus, an instrumentation/control apparatus having an automatic recorder and the like. In these apparatuses, the durability of the recording part can be largely improved.

Although Cr and Si are used as the first and second components in the preferred embodiments of the present invention as described above, the present invention is not restricted to these materials. As regards the first component, atoms capable of constituting a microcluster region and exhibiting electric conductivity can be used. For example, in addition to Cr, W, Mo, Ta and the like are given, and further a plurality of these atoms can be used at the same time. As to the second component, atoms capable of forming a compound with oxygen and the compound capable of forming to surround the microcluster regions and exhibiting an insulating property can be used. For example, in addition to Si, Ge, Ti, Al and the like are given, and also a plurality of these atoms can be used at the same time.

Although the thin film is formed by sputtering in the preferred embodiments of the present invention as described above, it is sufficient to obtain a thin film having the same structure as that of the thin film described above, and hence the thin film formation method and the heat treatment after the thin film formation are not restricted to those described in the preferred embodiments. For example, the CVD method can be used.

In a thin film resistor in an electronic circuit device according to the present invention, an electric conduction is mainly effected in the first regions composed of the first component metal atom. The second region composed of oxide of the second component atom can hardly contribute to the electric conduction but act as an insulating material, reduce the effective cross section of the electric conductor to increase the specific resistance of the thin film. Further, since the first regions are scattered in the second region, it is considered that the second region functions so as to diffuse and release the heat generated in the thin film resistor to the circuit board.

Further, the first regions are scattered in the second region, and an average particle size of the first regions is in a range of 2 to 20 nm. According to the inventor's researches, by forming the first regions so as to come in this particle size range, even when the thin film resistor is heated, the segregation of the first regions does not so proceed. Hence, the size of the first regions contributing the electric conduction are not so changed, and thus the specific resistance is also not so changed. Further, since the electric conductor of the first regions is protected by the oxide of the second region having a good thermal stability and surrounding the first regions, the structure of the thin film resistor is stable against a temperature of approximately 400° to 500° C. Thus, even when a heat cycle is given to the thin film resistor, a structural change of the atomic level is hardly caused.

According to the present invention, the thin film resistor having such an atomic level of structure is formed by a thin film formation process such as sputtering, and a multilayer wiring board capable of mounting semiconductor chips in high density and a heater device can be realized.

In an electronic circuit device of the present invention, a resistor has stable characteristics like a metal such as an electric resistance value change with reference to the temperature change. Further, by controlling a volume ratio between the microcluster regions of the first component such as Cr and the region of oxide such as $SiO_2$ of the second component, the specific resistance of the thin film resistor can be determined to the desired value.

Further, according to the present invention, by using an electronic circuit device to produce an electronic circuit, even when the heating is carried out in the production process of the electronic circuit or the thin film resistor is electrically heated, an electronic circuit board of a thin film multilayer board or the like having stable characteristics can be obtained.

As described above, according to the present invention, a thin film resistor having stable electric characteristics against the high temperature can be obtained, and by using this film resister, not only the degree of freedom for designing a high density heat generating circuit board is largely improved, but also a circuit board capable of mounting semiconductor chips in high density can be realized.

Although the present invention has been described in its preferred embodiments with reference to the accompanying drawings, it is readily understood that various changes and modifications can be made by those skilled in the art without departing from the spirit and scope of the present invention.

What is claimed is:

1. An electronic circuit device, comprising:
   a substrate; and
   at least one thin film resistor formed on the substrate, the at least one thin film resistor including:
   first regions each including at least one kind of atom and having an electric conductivity; and
   a second region including at least one compound composed of at least two kinds of atoms and having an insulating property,
   the first regions being scattered in the second region and having an average particle size of approximately 2 nm to 20 nm.

2. The device of claim 1, wherein the at least one kind of atom constituting the first regions is Cr.

3. The device of claim 1, wherein the at least two kinds of atoms constituting the at least one compound are Si and oxygen.

4. The device of claim 1, wherein the at least one compound constituting the second region is $SiO_2$.

5. The device of claim 1, further comprising an insulating film interposed between the substrate and the at least one thin film resistor.

6. An electronic circuit device, comprising:
a substrate;
a plurality of insulating films supported on the substrate;
at least one conductive film formed between any two adjacent insulating films;
at least one thin film resistor formed between any two adjacent insulating films;
wherein the at least on thin film resistor includes:
first regions each including at least one kind of atom and having an electric conductivity; and
a second region including at least one compound composed of at least two kinds of atoms and having an insulating property,
the first regions being scattered in the second region and having an average particle size of approximately 2 nm to 20 nm.

7. The device of claim 6, further comprising conductive films formed on the insulating films.

8. The device of claim 7, further comprising thin film resistors formed on the insulating films having the conductive films thereon, each insulating film having thin film resistors and conductive films thereon constituting a laminate unit, and a plurality of laminate units are laminated.

9. The device of claim 8, wherein the insulating films include at least one through-hole.

10. The device of claim 1, wherein a plurality of thin film resistors are arranged in parallel on the substrate.

11. The device of claim 10, wherein each thin film resistor having opposite ends is provided with electrodes on both the opposite ends to constitute a heater device.

12. The device of claim 11, wherein each thin film resistor includes the first regions composed of Cr atoms and the second region composed of a compound of a $SiO_2$.

13. The device of claim 12, wherein a barrier film is interposed between the each end of the thin film resistor and each electrode constituting a conductor to prevent the electrode from diffusing into the thin film resistor.

14. The device of claim 13, wherein the plurality of thin film resistors constitute a heater device of a thermal print head.

15. An electronic circuit device, comprising:
a substrate; and
at least one thin film resistor formed on the substrate, the at least one thin film resistor including:
first regions composed of Cr atoms; and
a second region composed of $SiO_2$,
the first regions being scattered in the second region and having an average particle size of approximately more than 2 nm.

16. The device of claim 15, wherein the Cr atoms form amorphous microcluster region, and the $SiO_2$ forms an amorphous structure region.

17. A method for producing an electronic circuit device, comprising the steps of:
forming a film on a substrate by sputtering a target including Cr and $SiO_2$;
patterning the film to form a resistor film; and
carrying out a heat treatment of the substrate having the resistor film thereon at a temperature of between 350° C. and 500° C.

18. The method of claim 17, wherein the target is a sintered body of a mixture of Cr and $SiO_2$.

19. The method of claim 17, wherein the target is composed of a Cr plate and $SiO_2$ plates partially arranged on the Cr plate.

20. The method of claim 17, wherein a $Cr/SiO_2$ presence ratio of a surface of the target is varied to change specific resistance of the thin film resistor.

21. The device of claim 6, further comprising at least one thin film resistor formed directly on the substrate, wherein the at least one thin film resistor formed directly on the substrate includes:
first regions each including at least one kind of atom and having an electric conductivity; and
a second region including at least one compound composed of at least two kinds of atoms and having an insulating property,
the first regions being scattered in the second region and having an average particle size of approximately 2 nm to 20 nm.

22. The device of claim 1, wherein the second region has an amorphous structure.

23. The device of claim 22, wherein the first regions have an amorphous microcluster structure.

24. The device of claim 23, wherein the at least one kind of atom constituting the first regions is Cr.

25. The device of claim 24, wherein the at least two kinds of atoms constituting the at least one compound are Si and oxygen.

26. The device of claim 6, wherein the second region has an amorphous structure.

27. The device of claim 26, wherein the first regions have an amorphous microcluster structure.

28. The device of claim 15, wherein the second region has an amorphous structure.

29. The device of claim 1, wherein said at least one kind of atom is selected from the group consisting of W, Mo an Ta.

30. The device of claim 29, wherein said at least two kinds of atoms constituting the at least one compound is oxygen and at least one selected from the group consisting of Ge, Ti and Al.

31. The device of claim 8, wherein the thin film resistors on the insulating films include at least one of said at least one thin film resistors.

* * * * *